(12) United States Patent
Bergstrom et al.

(10) Patent No.: US 7,257,461 B2
(45) Date of Patent: Aug. 14, 2007

(54) VIRTUAL PROGRAMMING OF FORMED COMPONENT TRAJECTORIES

(75) Inventors: Daniel Bergstrom, Sarver, PA (US); Jeffrey M. Shoup, Delmont, PA (US); Albert McGuire Hines, New Alexandria, PA (US)

(73) Assignee: Alcoa Inc., Pittsburgh, PA (US)

( * ) Notice: Subject to any disclaimer, the term of this patent is extended or adjusted under 35 U.S.C. 154(b) by 0 days.

(21) Appl. No.: 11/257,705

(22) Filed: Oct. 25, 2005

(65) Prior Publication Data

US 2006/0122726 A1    Jun. 8, 2006

Related U.S. Application Data

(60) Provisional application No. 60/622,242, filed on Oct. 25, 2004.

(51) Int. Cl.
*G06F 19/00* (2006.01)

(52) U.S. Cl. ............... 700/146; 700/165; 700/182

(58) Field of Classification Search ........... 700/146, 700/165, 182
See application file for complete search history.

(56) References Cited

U.S. PATENT DOCUMENTS

| 5,822,207 A * | 10/1998 | Hazama et al. ........ 700/97 |
| 5,969,973 A * | 10/1999 | Bourne et al. ........ 700/165 |
| 5,971,589 A * | 10/1999 | Hazama et al. ........ 700/145 |
| 5,988,855 A * | 11/1999 | Marobin ........ 700/145 |
| 6,954,679 B1* | 10/2005 | Takeda et al. ........ 700/165 |
| 2003/0090128 A1* | 5/2003 | Seksaria et al. ........ 296/192 |

\* cited by examiner

*Primary Examiner*—Ryan A Jarrett
(74) *Attorney, Agent, or Firm*—Greenberg Traurig LLP; Mauri A. Sankus

(57) ABSTRACT

This invention discloses a method for calculating gripper trajectories in forming equipment. The method utilizes a computer aided design (CAD) or a computer aided engineering (CAE) computer program to calculate the appropriate location, speed, controller commands, and trajectory for each gripper used during a forming process.

10 Claims, 1 Drawing Sheet

VIRTUAL PROGRAMMING OF FORMED COMPONENT TRAJECTORIES

CROSS REFERENCE TO RELATED APPLICATIONS

This application claims the benefit of U.S. Provisional Application Ser. No. 60/622,242, which was filed on Oct. 25, 2004, the disclosure of which is fully incorporated by reference herein.

FIELD OF THE INVENTION

This invention generally relates to stretch formers/benders. In particular, this invention describes a method for determining the trajectory of the machine components through the use of a computer program.

BACKGROUND OF THE INVENTION

The stretch forming process, often used to produce formed automotive, aerospace, as well as other types of components, requires the coordinated movements of various members of the forming apparatus in order to produce parts that meet or exceed customer requirements. The stretch forming process, which can be used on multiple types of materials, can be summarized in the following steps. As can be seen in FIGS. 1A, 1B, 2A, and 2B a blank 2 (consisting of one or more components) is held by one or more grippers 4 at one or more locations. The grippers 4 are then moved in pre-determined directions to place the blank 2 under tension. While under tension, the blank 2 is then wrapped around a forming die 6 that can either be stationary (as depicted in 1A and 1B) or non-stationary (as depicted in FIGS. 2A and 2B). Additional tension, known as post-stretch, may be applied to set the blank 2 into its final shape.

A number of manufacturers produce a variety of stretch forming/bending machinery (i.e. forming equipment or bender). Each model of forming equipment will typically have different degrees of freedom when compared to other models. Degrees of freedom may include the wrap angle, tension, elevation, and twist of the grippers. Each set of gripper trajectories are unique to the specific component (end product) that is being manufactured.

After the forming die is designed and manufactured, the die is secured to the forming equipment. The blank is cut to a specified size and inserted into the grippers that are located near the ends of the forming die. The grippers use mechanical and/or hydraulic actuation to hold portions of the blank securely in place. The grippers must then follow unique paths, or trajectories, in order to form the blank using the contour of the forming die. Development of these trajectories, or "part teaching," is tedious and time consuming when done at the forming machine control console. It generally involves manual manipulation of each degree of freedom at incremental bend angles along the length of a part. This manual manipulation is done by visual inspection of the interface between the blank and the forming die. Each degree of freedom is adjusted at each bend angle increment, until the blank "appears" to be adjacent to and in contact with the contour of the forming die. Once these variables are developed manually, they are stored in a computer file that can be inputted into a computer so that the forming equipment may mimic the stored gripper trajectories. This part teaching process can often take hours, days or even weeks of development time for each individual component being produced. Additionally, this labor intensive process disrupts the production routine.

SUMMARY OF THE INVENTION

This invention discloses a method for calculating gripper trajectories in forming equipment. The method includes: providing a forming die, using a computer aided design (CAD) or a computer aided engineering (CAE) computer program to extend tangents from the forming die at various positions through the forming cycle wherein each tangent corresponds to the location of one or more grippers during the forming process; calculating the wrap angle, tension, elevation, tilt, and twist of each of the grippers at each of the tangents; recording the wrap angle, tension, elevation, tilt and twist of each of the grippers at each of the tangent locations into a first computer file; recording the initial gripper positions, amount of pre- and post-stretch imparted on a blank, and initial blank size into said first computer file; and inputting the first computer file into a first computer program to calculate an appropriate location, speed, controller commands, and trajectory for each of the grippers during the forming process wherein the first computer program produces an output that is then recorded in a second computer file that is read and executed by said forming equipment thereby producing a product with the desired part geometry.

This invention also discloses a formed component manufactured from a method includes: providing a forming die, using a computer aided design (CAD) or a computer aided engineering (CAE) computer program to extend tangents from the forming die at various positions through the forming cycle wherein each tangent corresponds to the location of one or more grippers during the forming process; calculating the wrap angle, tension, elevation, tilt, and twist of each of the grippers at each of the tangents; recording the wrap angle, tension, elevation, tilt and twist of each of the grippers at each of the tangent locations into a first computer file; recording the initial gripper positions, amount of pre- and post-stretch imparted on a blank, and initial blank size into said first computer file; and inputting the first computer file into a first computer program to calculate an appropriate location, speed, controller commands, and trajectory for each of the grippers during the forming process wherein the first computer program produces an output that is then recorded in a second computer file that is read and executed by said forming equipment thereby producing a product with the desired part geometry.

An aspect of this invention is to manufacture a higher quality end product by eliminating the current manual method used in industry to "teach" the forming equipment how to form a part.

Another aspect of this invention is to optimize blank size by using more precise trajectories thereby minimizing end scrap.

Another aspect of this invention is to decrease the total amount of time needed to "part teach" the forming equipment.

Another aspect of this invention is to prevent potential damage to the forming die or forming equipment during the "part teaching" process.

DETAILED DESCRIPTION OF PREFERRED EMBODIMENTS

Figure 1A:
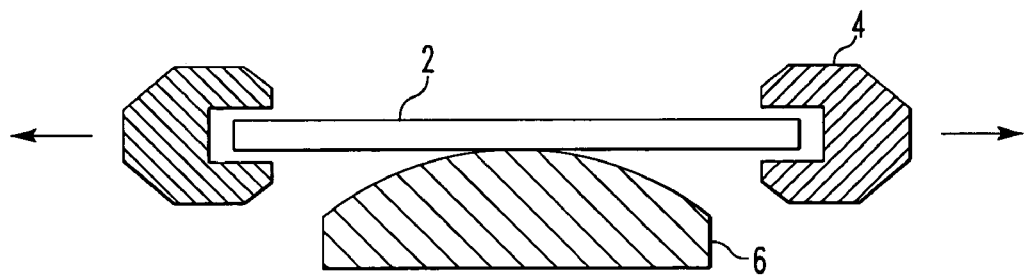
FIGS. 1A and 1B depict a forming process that utilizes a stationary forming die.
Figure 1B:
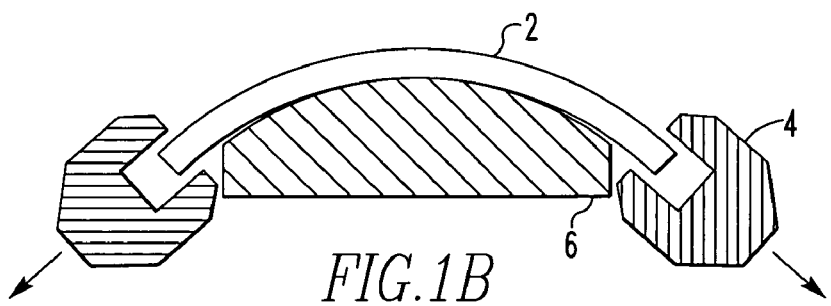
Figure 2A:
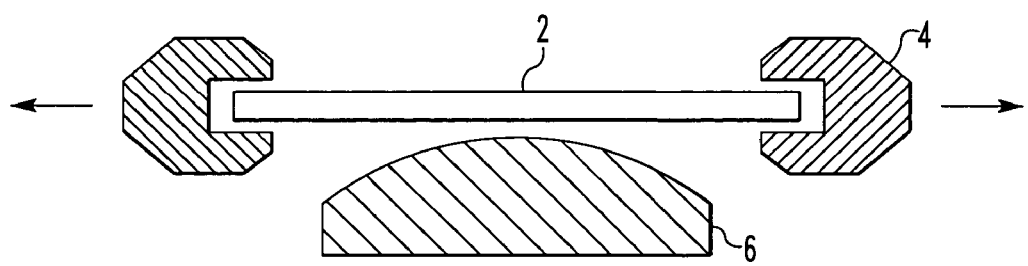
FIGS. 2A and 2B depict a forming process that utilizes a non-stationary forming die.
Figure 2B:
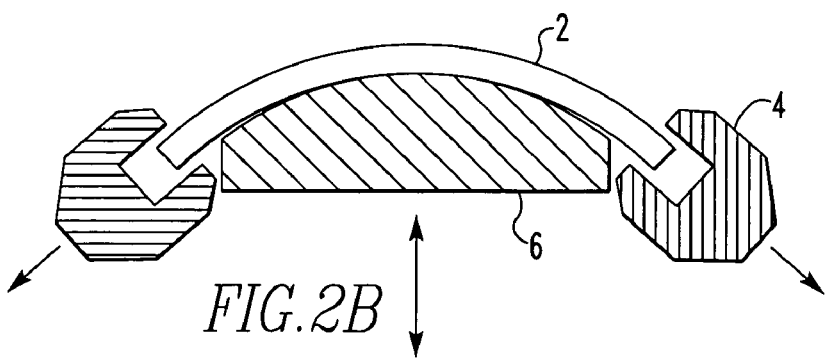

The accompanying drawings and the description which follows set forth this invention in its preferred embodiment. However, it is contemplated that persons generally familiar with forming processes will be able to apply the novel characteristics of the structures and methods illustrated and described herein in other contexts by modification of certain details. Accordingly, the drawings and description are not to be taken as restrictive on the scope of this invention, but are to be understood as broad and general teachings. When referring to any numerical range of values, such ranges are understood to include each and every number and/or fraction between the stated range minimum and maximum. Finally, for purposes of the description hereinafter, the terms "upper", "lower", "right", "left", "vertical", "horizontal", "top", "bottom", and derivatives thereof shall relate to the invention, as it is oriented in the drawing figures.

When referring to "blank" or "blanks" such designations are meant to encompass deformable bodies including, but not limited to extrusions, sheets, plate, and/or forgings that are manufactured or fabricated from a metallic or non-metallic material. For instance, the blank can be manufactured from an aluminum alloy that is selected from the Aluminum Association's 1XXX, 2XXX, 3XXX, 4XXX, 5XXX, 6XXX, 7XXX, or 8XXX series of aluminum alloys. In addition, the blank can also be manufactured from a steel, a plastic or a polymer. In another embodiment, the blank is manufactured from titanium. In yet another embodiment, the blank is manufactured from a metal alloy. When referring to "virtual" or "virtually" such designations are meant to encompass computer simulations.

The present invention involves the precise determination of each degree of freedom at any specified bend angle utilizing computer generated gripper trajectories. Accordingly, "part teaching" is done without actually using the forming equipment. Additionally, by using the method that is disclosed in this invention production interruptions are no longer necessary in order to develop the trajectories since the trajectories are calculated unambiguously by a computer model. Furthermore, the resulting trajectories are not only smoother and more accurate than their manually derived counterparts, which produces higher quality end products, but the trajectories can also be read and executed by the forming apparatus itself thereby reducing the total amount of time required to develop a product.

Through the use of computer aided design (CAD) or a computer aided engineering (CAE) tools a specific forming die contour can be used in conjunction with the forming equipment component geometry to determine the relevant degrees of freedom at any position throughout the forming process. The degrees of freedom of each gripper as well as the location of each gripper at a particular point in time are determined by utilizing the CAD or CAE tools to extend tangents from the forming die (i.e. part profile) at various positions along the die. The forming surface is typically, but not necessarily, the die surface. Each position along the die corresponds to where the grippers should be in order for the blank to maintain tangency with the forming die. At each pre-determined tangent location, the individual degrees of freedom are measured and recorded. As more tangent locations are evaluated and measured, the quality (i.e. precision) of the end product is dramatically improved since the degrees of freedom and the location of each gripper during the entire forming process is determined. Once a sufficient number of tangent locations have been evaluated, the data (i.e. degrees of freedom as well as the location of the grippers at each tangent point) is recorded (i.e. stored or saved) into a first computer file hereafter referred to as the KCF file. The KCF file could also contain data relating to the product as well as the specific forming process. For instance, the computer file can contain information such as initial gripper positions, data relating to whether the blank will undergo pre- or post stretching, initial blank size, and blank identification data. The KCF file is then inputted into a first computer program, hereafter referred to as the conversion program, which transforms the data into appropriate units of location, speed, controller commands, and trajectories that may be executed by the forming machine. In other words, the KCF file is translated into a machine language that the forming machine can utilize.

Upon the successful execution of the conversion program, the KCF file is converted into a second computer file hereafter referred to as the part program file. The part program file is the actual control file that is read and executed by the forming equipment to produce the desired part geometry. In other words, the part program file is encoded in the machine language that the forming equipment can read. If modifications to the gripper degrees of freedom are needed in order to improve part quality, the modifications can quickly be made to the KCF file, and immediately converted to the part program file via the conversion program. Traditional part program modifications, done manually at the console, can often take more than an hour to accomplish. In contrast, the method that is disclosed in this invention can effect similar modifications within a matter of minutes. Furthermore, these modifications can be made from a remote location and transmitted to the forming equipment through a variety of means. For instance, the modifications can be transmitted via a computer network, a telephone network, or a wireless network.

In another embodiment, the first computer can be inputted into a second computer program that can model the entire forming process using the data stored on the first computer file. By using the data stored on the first computer file, the second computer program can simulate the entire forming process in a three-dimensional (3D) computer model. In one embodiment, the KCF file is converted by the second computer program into a Finite Element Analysis computer language in order to simulate the forming process in a three-dimensional computer model that is displayed on a computer or television screen. By "virtually" modeling the forming process in a computer model, the disclosed invention provides a rapid visual confirmation that the resulting trajectories are correct thereby allowing the user to detect whether there are improper clearances between the tooling, blank, and/or forming equipment. This virtual inspection of the clearances also prevents any potential damage that might occur to the forming equipment or the forming die during the "part teaching" phase since the actual forming equipment is not used to develop the gripper trajectories.

Having described the presently preferred embodiments, it is to be understood that the invention may be otherwise embodied within the scope of the appended claims.

What is claimed is:

1. A method for forming a component comprising:
   providing a forming surface;
   using a computer aided design (CAD) or a computer aided engineering (CAE) computer program to extend tangents from said forming surface at various positions through a forming cycle, said tangents correspond to the location of one or more grippers during a forming process;

calculating wrap angle, tension, elevation, tilt, and twist of each of said one or more grippers at each of said tangents;

recording the wrap angle, tension, elevation, tilt and twist of each of said one or more grippers at said tangent locations into a first computer file;

recording initial one or more gripper positions, amount of pre- and post-stretch imparted on a blank, and initial blank size into said first computer file; and inputting said first computer file into a first computer program to calculate appropriate location, speed, controller commands, and trajectory for said one or more grippers during said foming process, said first computer program produces an output that is then recorded in a second computer file that is read and executed by said forming equipment thereby producing said formed component with a desired part geometry.

2. The method according to claim 1 wherein providing a forming surface comprises providing a stationary or non-stationary forming surface.

3. The method according to claim 1 further comprising inputting said first computer file into a second computer program; said second computer program models said forming process using the data stored on said first computer file and displays said model.

4. The method according to claim 1 further comprising transmitting said second computer file to said forming equipment via a computer network, telephone network, or a wireless net work.

5. The method according to claim 1 wherein said blank is manufactured a deformable material.

6. The method according to claim 5 wherein said blank is manufactured from a metal or a metal alloy.

7. The method according to claim 6 wherein said metal or metal alloy is an aluminum or an aluminum alloy.

8. The method according to claim 7 where said blank is manufactured from an aluminum alloy selected from the Aluminum Association's 1XXX, 2XXX. 3XXX, 4XXX, 5XXX, 6XXX, 7XXX, or 8XXX series of aluminum alloys.

9. The method according to claim 5 wherein said blank is manufactured from a non-metallic material.

10. The method according to claim 9 wherein said non-metallic material is a plastic or a polymer.

\* \* \* \* \*